(12) United States Patent
Yoshimura et al.

(10) Patent No.: US 11,174,554 B2
(45) Date of Patent: Nov. 16, 2021

(54) SUBSTRATE TRAY FOR USE IN THIN-FILM FORMATION DEVICE

(71) Applicants: CORE TECHNOLOGY, INC., Iruma (JP); ASKAGI CORPORATION, Fukuoka (JP)

(72) Inventors: Toshiaki Yoshimura, Iruma (JP); Hiroyuki Minowa, Iruma (JP); Lung Kei Amos Shek, Iruma (JP)

(73) Assignees: CORE TECHNOLOGY, INC., Saitama (JP); ASKAGI CORPORATION, Fukuoka (JP)

( * ) Notice: Subject to any disclaimer, the term of this patent is extended or adjusted under 35 U.S.C. 154(b) by 609 days.

(21) Appl. No.: 16/080,380

(22) PCT Filed: Mar. 3, 2016

(86) PCT No.: PCT/JP2016/056685
§ 371 (c)(1),
(2) Date: Aug. 28, 2018

(87) PCT Pub. No.: WO2017/149740
PCT Pub. Date: Sep. 8, 2017

(65) Prior Publication Data
US 2021/0180186 A1    Jun. 17, 2021

(51) Int. Cl.
*C23C 16/50* (2006.01)
*C23C 16/458* (2006.01)
*H01J 37/32* (2006.01)

(52) U.S. Cl.
CPC .......... *C23C 16/4583* (2013.01); *C23C 16/50* (2013.01); *H01J 37/32715* (2013.01); *H01J 2237/3321* (2013.01)

(58) Field of Classification Search
CPC .................. C23C 16/4583; C23C 16/50; H01J 37/32715; H01J 2237/3321
See application file for complete search history.

(56) References Cited

U.S. PATENT DOCUMENTS

2005/0155557 A1* 7/2005 Hwang ............... H01L 21/6875
                                                            118/728
2005/0174027 A1   8/2005 Takase et al.
(Continued)

FOREIGN PATENT DOCUMENTS

JP    S59-54929 U    4/1984
JP    2004273445 A   9/2004
(Continued)

OTHER PUBLICATIONS

International Search Report dated Jun. 14, 2016 for PCT/JP2016/056685 and English translation.

*Primary Examiner* — Yuechuan Yu
(74) *Attorney, Agent, or Firm* — Lucas & Mercanti. LLP

(57) ABSTRACT

Provided is a substrate tray which is to be used in a thin-film formation device and makes it easy to improve film quality and film thickness uniformity on a substrate by improving substrate heating efficiency and substrate heating uniformity. Thus, a substrate tray to be used in a thin-film formation device and characterized in that: wherein there are formed substrate mountable spaces each of which substantially corresponds to a substrate shape by installing partition frames arranged in matrix each of which has a substantial quadrangular frame shape within an outer frame and by partitioning inside of the outer frame in a grid, wherein a plurality of wires are installed between front and rear side frames mutually opposing within the outer frame and each partition frame is connected and supported by the wires, and wherein the substrate is mountable on a substrate support portion of a lower partition frame joined to a bottom surface of an upper partition frame in the partition frame or on the wires crossing the substrate mountable spaces.

11 Claims, 14 Drawing Sheets

(56) References Cited

U.S. PATENT DOCUMENTS

| | | | |
|---|---|---|---|
| 2011/0174217 A1* | 7/2011 | Gersdorff | C23C 16/042 |
| | | | 118/500 |
| 2013/0298836 A1 | 11/2013 | Ikenaga et al. | |
| 2014/0014499 A1 | 1/2014 | Cousins et al. | |

FOREIGN PATENT DOCUMENTS

| JP | 2006319005 A | 11/2006 |
|---|---|---|
| JP | 2012162752 A | 8/2012 |
| JP | 2013184717 A | 9/2013 |
| JP | 2014012894 A | 1/2014 |

\* cited by examiner

SUBSTRATE TRAY FOR USE IN THIN-FILM FORMATION DEVICE

CROSS REFERENCE TO RELATED APPLICATION

This Application is a 371 of PCT/JP2016/056685 filed on Mar. 3, 2016, which is incorporated herein by reference.

TECHNICAL FIELD

The present invention relates to a substrate tray for use in a thin-film formation device.

BACKGROUND ART

Conventionally, a substrate tray for use in a vapor phase growth apparatus has a structure in which a recess for engaging a substrate therein is formed on an upper surface of a substrate tray body and a semiconductor substrate or a glass substrate is engaged in the recess and further such substrate tray is superimposed with a heater. Further, while heating the substrate through the substrate tray by the heater, thin-film formation is conducted on an upper surface of the substrate by a plasma CVD (Chemical Vapor Deposition) or a heat CVD device over the substrate (for example, see Patent Literature 1)

CITATION LIST

Patent Literature

PLT1: Japanese Patent Application laid open No. 2012-162752

SUMMARY OF INVENTION

Technical Problem

In the conventional substrate tray mentioned in the above, it is adopted the structure in which the recesses are formed on the upper surface of the substrate tray body at predetermined intervals and the substrate is engaged in the recess. The substrate tray body is layered on the heater (heating heater plate) and the substrate engaged in the substrate tray body is heated through the substrate tray body. In such substrate tray body, it is necessary at least degree of a few millimeter~tens of millimeter for a thickness from an inner bottom surface of the recess to a bottom surface of the substrate tray body to maintain strength of the substrate tray body. Therefore, due to that the substrate is heated by conduction heat through the substrate tray, heat conduction efficiency becomes bad and moreover it lacks in heating uniformity since adhesion of the back surface of the substrate tray and the surface of the heater (heating heater plate) is not complete due to warp or distortion by heat expansion. Thereby, there will be a fear that film formation by the plasma CVD or heat CVD device cannot be equalized and film quality cannot become good.

The present invention provides a substrate tray for use in a thin-film formation device according to which it can be easily conducted film formation that both film formation uniformity onto the substrate and film quality can be improved.

Solution to Problem

The invention according to claim 1 provides a substrate tray for use in a thin-film formation device, wherein there are formed substrate mountable spaces each of which substantially corresponds to a substrate shape by installing partition frames arranged in matrix each of which has a substantial quadrangular frame shape within an outer frame and by partitioning inside of the outer frame in a grid, wherein a plurality of wires are installed between front and rear side frames mutually opposing within the outer frame and each partition frame is connected and supported by the wires, and wherein the substrate is mountable on a substrate support portion of a lower partition frame joined to a bottom surface of an upper partition frame in the partition frame or on the wires crossing the substrate mountable spaces.

The invention according to claim 2 is characterized in that: in the substrate tray for use in a thin-film formation device, wherein as a structure to insert and penetrate the wire through a thickness of the partition frame, in a case that a penetration hole is opened in a center of the thickness by a drill, the partition frame is formed by layering the upper partition frame and the lower partition frame in upper and lower two layers and by joining the upper and lower partition frames through diffusion bonding, spot welding or screwing, and wherein the wires are clamped in a groove formed in a layer surface of the upper and lower partition frames.

The invention according to claim 3 is characterized in that: in the substrate tray for use in a thin-film formation device, wherein a tension mechanism to give a tension to the wire is provided on an outer side surface of the outer frame, and wherein the tension mechanism is constituted from a slide body to which one end of the wire is connected, a slide shafts to conducting slide guide of the slide body and coil springs wound around the slide shafts intervening between the outer frame and the slide body.

The invention according to claim 4 is characterized in that: in the substrate tray for use in a thin-film formation device, wherein the slide shafts have left and right two shafts inserted and penetrated in left and right portions of the slide body and guide the left and right portions of the slide body.

The invention according to claim 5 is characterized in that: in the substrate tray for use in a thin-film formation device, wherein a distance between a bottom surface of the partition frame and the substrate support portion or an upper surface of the wire lies in a range of 1150 µm~1250 µm.

Advantageous Effects of Invention

According to the invention of claims 1 and 2, wherein there are formed substrate mountable spaces each of which substantially corresponds to a substrate shape by installing partition frames arranged in matrix each of which has a substantial quadrangular frame shape within an outer frame and by partitioning inside of the outer frame in a grid, wherein a plurality of wires are installed between front and rear side frames mutually opposing within the outer frame and each partition frame is connected and supported by the wires, and wherein the substrate is mountable on a substrate support portion of a lower partition frame joined to a bottom surface of an upper partition frame in the partition frame or on the wires crossing the substrate mountable spaces, and wherein as a structure to insert and penetrate the wire through a thickness of the partition frame, in a case that a penetration hole is opened in a center of the thickness by a drill, the partition frame is formed by layering the upper partition frame and the lower partition frame in upper and lower two layers and by joining the upper and lower partition frames through diffusion bonding, spot welding or screwing, and wherein the wires are clamped in a groove formed in a layer surface of the upper and lower partition frames. As mentioned, when the substrate is mounted on the substrate mountable space formed by the partition frame, the substrate is mounted on the substrate support portion protruded in that space or the wires stretched in that space, thereby the substrate can be arranged between the partition frames in grid. Therefore, there is no member to block heat in a clearance to the heating element (heating heater plate) arranged downward, thus radiant heat can be directly irradiated. As a result, heat transfer loss can be reduced as much as possible and heating can be done in a short time and moreover uniformity of heating to the substrate can be obtained. As in the past, in a case that the substrate tray in which the substrate is fitted in is mounted on the heating heater plate, since the substrate tray cannot be closely mounted in a complete flat state on the heating heater plate (due to warp or distortion of the substrate tray), temperature difference is partially produced and this tendency is large as the area of the substrate tray becomes larger. Thus, temperature distribution of the substrate becomes bad and negative influence is given to the film thickness uniformity and film quality of film formation by the plasma CVD device or the CVD device. However, according to the present invention, since the substrate is mounted on the substrate support portion or the wires, temperature distribution is not biased even though the large area substrate tray is used, therefore uniform film formation can be obtained.

According to the invention according to claims 3 and 4, wherein a tension mechanism to give a tension to the wire is provided on an outer side surface of the outer frame, and wherein the tension mechanism is constituted from a slide body to which one end of the wire is connected, a slide shafts to conducting slide guide of the slide body and coil springs wound around the slide shafts intervening between the outer frame and the slide body and wherein the slide shafts have left and right two shafts inserted and penetrated in left and right portions of the slide body and guide the left and right portions of the slide body. Thereby, according to the tension mechanism, deflection of the wires due to heat expansion of the wires is adsorbed and it becomes a structure that the wires are tensioned with a predetermined tension. Therefore, support of the partition frame can be certainly done and it can be certainly retained a predetermined space between the substrate on the substrate support portion or the wire and the heating heater plate. Further, uniform temperature distribution can be formed on the whole substrate (by radiant heat), therefore film formation with good quality and uniformity can be conducted.

According to the invention of claim 5, the space between the wires mounting the substrate and the heating heater plate mounting the substrate tray in which the partition frames are provided becomes a predetermined space. Therefore, heat loss of radiant heat from the heating heater plate can be prevented as much as possible. Further, since there is no object to interfere therebetween, heat diffusion becomes uniform and temperature plaque is reduced, therefore there is an effect that uniform film formation can be conducted.

DESCRIPTION OF EMBODIMENTS

The main part of the invention lies in a substrate tray for use in a thin-film formation device, wherein there are formed substrate mountable spaces each of which substantially corresponds to a substrate shape by installing partition frames arranged in matrix each of which has a substantial quadrangular frame shape within an outer frame and by partitioning inside of the outer frame in a grid, wherein a plurality of wires are installed between front and rear side frames mutually opposing within the outer frame and each partition frame is connected and supported by the wires, and wherein the substrate is mountable on a substrate support portion of a lower partition frame joined to a bottom surface of an upper partition frame in the partition frame or on the wires crossing the substrate mountable spaces, and further lies in the substrate tray for use in a thin-film formation device, wherein as a structure to insert and penetrate the wire through a thickness of the partition frame, in a case that a penetration hole is opened in a center of the thickness by a drill, the partition frame is formed by layering the upper partition frame and the lower partition frame in upper and lower two layers and by joining the upper and lower partition frames through diffusion bonding, spot welding or screwing, and wherein the wires are clamped in a groove formed in a layer surface of the upper and lower partition frames, and furthermore lies in the substrate tray for use in a thin-film formation device, wherein a tension mechanism to give a tension to the wire is provided on an outer side surface of the outer frame, and wherein the tension mechanism is constituted from a slide body to which one end of the wire is connected, a slide shafts to conducting slide guide of the slide body and coil springs wound around the slide shafts intervening between the outer frame and the slide body, and furthermore lies in the substrate tray for use in a thin-film formation device, wherein the slide shafts have left and right two shafts inserted and penetrated in left and right portions of the slide body and guide the left and right portions of the slide body, and furthermore lies in the substrate tray for use in a thin-film formation device, wherein a distance between a bottom surface of the partition frame and the substrate mountable position or an upper surface of the wire lies in a range of 1150 μm~1250 μm.

Figure 1:
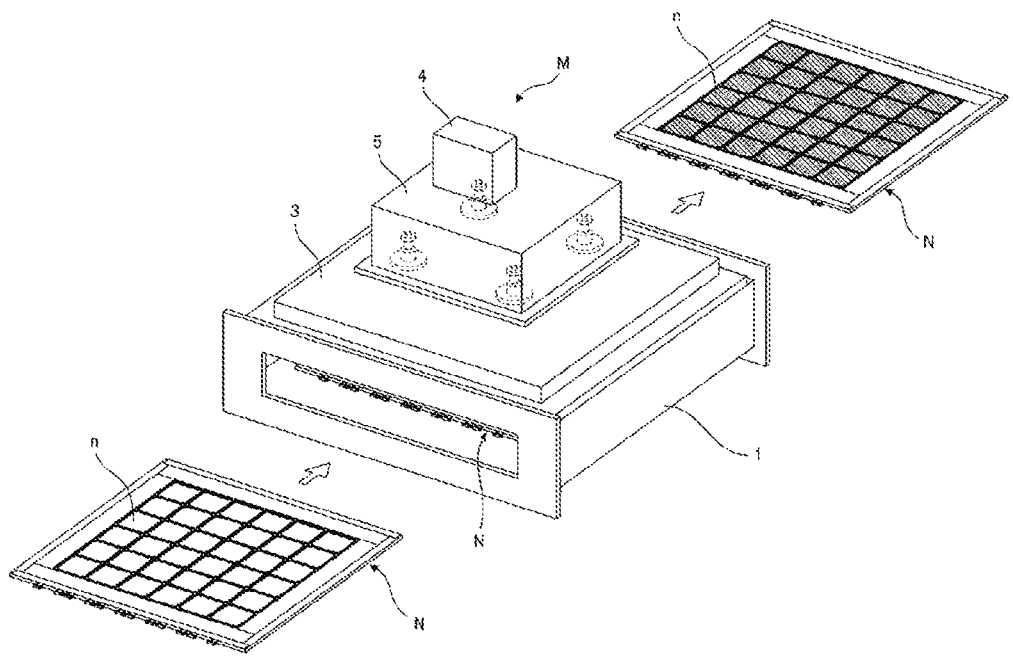
FIG. 1 is a perspective view showing a whole constitution of a plasma treatment device.
Figure 3:
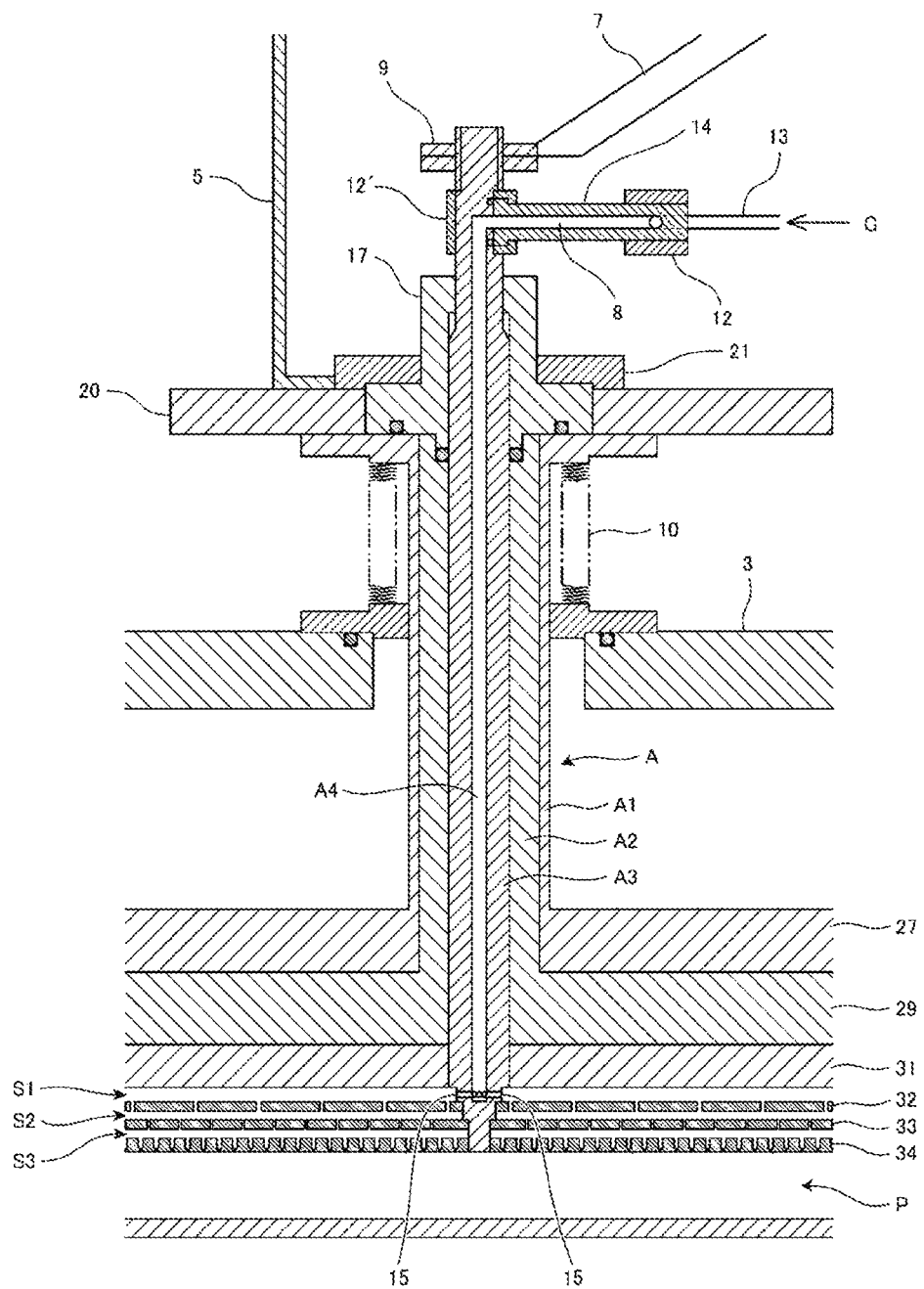
FIG. 3 is a view in which a main part of FIG. 2 is enlarged and shown.
Figure 4:
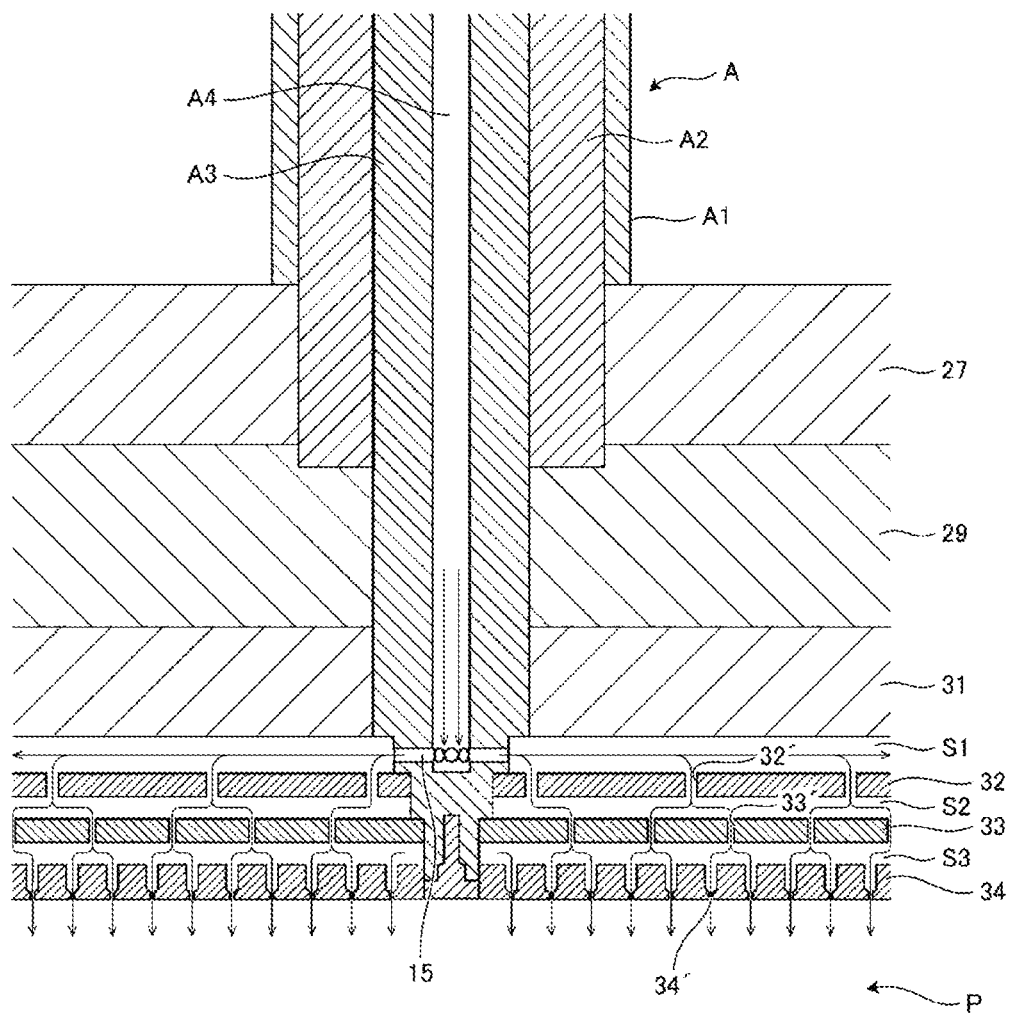
FIG. 4 is a view in which a main part of FIG. 3 is enlarged and shown.

Hereinafter, with reference to the drawings, the embodiment of the present invention will be described. Here, the embodiment will be described, for example, based on a plasma CVD device which has more complex constitution than a heat CVD device. FIG. 1 is a perspective view showing a whole constitution of a plasma treatment device, FIG. 2 is an explanatory view to explain a sectional constitution of the plasma treatment device, FIG. 3 is a view in which a main part of FIG. 2 is enlarged and shown, and FIG. 4 is a view in which a main part of FIG. 3 is enlarged and shown.

FIG. 1 shows a plasma treatment device M for using a substrate tray N of the present invention. In the plasma treatment device M, a lid member 3 close an upper portion of a reaction vessel body 1 formed in a hollow box shape, and on a lid member 3, a shield box 5 which is covered so that high frequency is not leaked out is mounted on an electrode elevation plate 20 through a supporting cylinder 10 (see FIG. 2) with a bellows shape. Further, the electrode elevation plate 20 is supported by a vertical drive mechanism (not shown) installed on the lid member 3.

Figure 2:
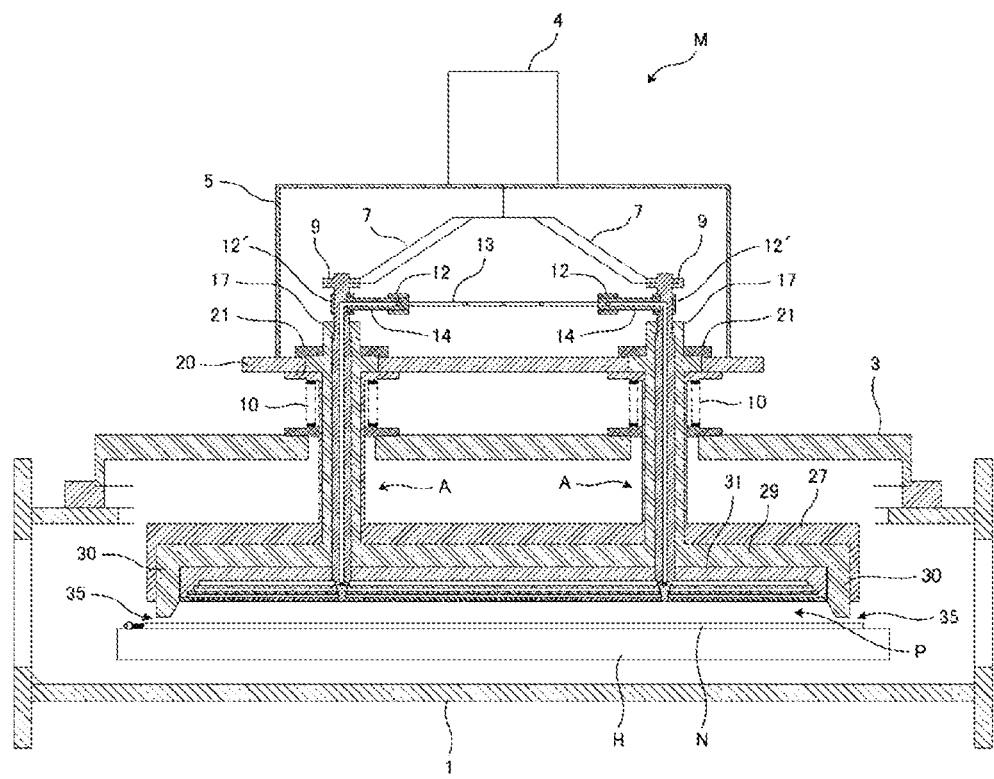
FIG. 2 is an explanatory view to explain a sectional constitution of the plasma treatment device.

As shown in FIG. 2, on an upper portion of the shield box 5, a high frequency matching device 4 is mounted and the high frequency matching device 4 is connected to a high frequency power supply (not shown).

Through the shield box 5, the supporting cylinder 10 and the reaction vessel body 1, as shown in FIG. 2, a plurality of electrode rods A are established by inserting and penetrating the shield box 5, the supporting cylinder 10 and the reaction vessel body 1. As shown in FIG. 3, the electrode rods A are formed from a plurality of overlay pipes and in each of the electrode rods A, a shield pipe A1, an insulative pipe A2 and a high frequency conduit A3 in which a gas communication hole A4 is formed in a center thereof are concentrically overlaid and stored with each other.

Within the shield box 5, to a ceiling portion of the shield box 5, there are provided wiring boards 7 for conducting high frequency from the high frequency matching device 4. A top portion of each wiring board 7 is connected by a nut 9 to a head top portion of the high frequency conduit A3 in which the gas communication hole A4 is formed, thereby a plurality of electrode rods A are constituted.

That is, in the electrode rod A, an end portion of the wiring board 7 is connected to the head top portion of the high frequency conduit A3, in which the gas communication hole A4 is formed, through the nut 9 and the high frequency conduit A3 in which the gas communication hole A4 is opened is connected through connection fittings 12' having an insulative gas introduction pipe 14 arranged within the shield box 5 and an O-ring. Further, a top portion of the insulative gas introduction pipe 14 is connected through connection fittings 12 having a stainless pipe of a process gas pipe 13 and an O-ring.

Here, it is desirable that the insulative gas introduction pipe 14 is made of insulator such as quarts, alumina ceramic, steatite and ethylene polytetrafluoroethylene (PTFE) and the like.

The top head of the high frequency conduit A3 is connected to the insulative gas introduction pipe 14, thereby a gas communication path 8 of the insulative gas introduction pipe 14 and the gas communication hole A4 penetrating the center of the high frequency conduit A3 are communicated. In the center of the electrode rod A, an outer periphery of the high frequency conduit A3 in which the gas communication hole A4 penetrates is enclosed by the insulative pipe A2.

Here, the high frequency conduit A3 connected to the high frequency matching device 4 through the wiring board 7 is enclosed by a insulative ring 17 so that the insulative ring 17 is clamped to the electrode elevation plate 20 by the supporting cylinder 10 and a metallic flange 21, thereby the high frequency conduit A3 is fixed by a structure electrically insulated from outside.

As mentioned, the electrode rod A is constituted so that the shield pipe A1, the insulative pipe A2, the high frequency conduit A3 and the gas communication hole A4 are concentrically and sequentially stored toward the center thereof from outside, the head portion of the electrode rod A is communicated with the insulative gas introduction pipe 14 in the shield box 5 and the head top portion of the high frequency conduit A3 is connected to the high frequency matching device 4 through the wiring board 7 and conducted.

The electrode rod A is extended in the reaction vessel body 1 by penetrating the lid member 3. Within the reaction vessel body 1, there are provided a shield plate 27 having a box shape an under portion of which is opened downward and a side insulative plate 30 which is formed by vertically standing a peripheral edge of an insulative plate 29 (see FIG. 2) in a skirt shape. An electrode plate 31 is stored inside of the insulative plate 29 and the side insulative plate 30 and an inner peripheral portion of the electrode plate 31 is processed in a stepwise fashion. As shown in FIGS. 2 and 4, a gas dispersion plate 32, an intermediate dispersion plate 33 and a gas shower plate 34 are layered and stored, further it is adopted a constitution in which a gas dispersion space S1, S2 and S3 are intervened between each two layers.

A lower portion of the electrode rod A penetrates the shield plate 27, the insulative plate 29, the electrode plate 31, the gas dispersion plate 32 and the intermediate dispersion plate 33 and reaches the gas shower plate 34

Moreover, the high frequency conduit A3 of the electrode rod A penetrates the electrode plate 31 and contacts to the electrode plate 31, thereby it is constituted so that high frequency is energized to the electrode plate 31, the gas dispersion plate 32, the intermediate dispersion plate 33 and the gas shower plate 34. On the other hand, it is constituted so that the gas communication hole A4 of the electrode rod A sequentially communicates with the gas dispersion space S1, S2 and S3 and the process gas is uniformly supplied to the plasma discharge space P.

That is, a lowest portion of the gas communication hole A4 is communicated with the gas dispersion space S1 with height of 3 mm~5 mm through side communication passages 15 formed in a peripheral wall of the high frequency conduit A3.

In the gas dispersion plate 32 with a thickness of 2 mm~5 mm positioned at a position lower than the gas dispersion space S1, there are drilled many upper small holes 32' with a diameter of 1.5 mm~2.0 mm to communicate gas downward and positions of the upper small holes 32' are set to regular symmetric positions centered on an intersection position of four corners in a virtual square.

At a lower layer of the gas dispersion plate 32, the intermediate dispersion plate 33 is layered through the intermediate gas dispersion space S2 with a distance (clearance) of 2~3 mm. In the intermediate dispersion plate 33, there are drilled many intermediate small holes 33' with a diameter of 0.8 mm~1.5 mm to communicate gas downward and positions of the intermediate small holes 33 are set to regular point positions within a frame of the intersection position of four corners in a virtual square (center) of the upper small holes 32'.

At a lower layer of the gas dispersion space S2, the gas shower plate 34 with a thickness of 5 mm~8 mm is layered through the lower gas dispersion space S3 with a distance (clearance) of 2 mm~3 mm. In the gas shower plate 34, there are drilled many lower small holes 34' and positions of the lower small holes are set to regular positions diffused in all directions centered on a corresponding position of the intermediate small holes 33'.

Especially, in each of the lower small holes 34', a lower end is formed in a tapered shape and a lower opening diameter is set to 0.5 mm~0.8 mm.

Under the gas shower plate 34, the plasma discharge space P with a predetermined distance (clearance) is formed.

Periphery of the plasma discharge space P is enclosed by the side insulative plate 30 of the insulative plate 29 and gas discharged from the lower small holes 34' of the gas shower plate 34 produces plasma discharge within a section of the side insulative plate 30 by high frequency power.

At that time, since the plasma discharge space S is enclosed and sectioned by the side insulative plate 30 of the insulative plate 29, the plasma discharge can be confined. Therefore, according to this confinement, both high frequency output and flow rate of the process gas can be reduced and film formation on the substrate can be qualified and uniformed.

As mentioned, the electrode plate 31 is stored in the insulative plate 29 in which the side insulative plate 30 is vertically stood in a skirt shape, and under the electrode plate 31, the gas dispersion plate 32, the intermediate dispersion plate 33 and the gas shower plate 34 each having small holes are layered, therefore the process gas ejected and dispersed from many small holes regularly drilled on each plate is finely diffused from the gas shower plate 34 and finally reaches the plasma discharge space P. Thereby, the plasma discharge is conducted in upper space of a substrate tray N or a heating heater plate H and film formation can be done on a substrate n on the substrate tray N. The heating heater plate H is connected to the ground.

Under the plasma discharge space P of the plasma treatment device M constituted in the above, the substrate tray N is arranged. Here, between the substrate tray N and the lower end of the side insulative plate 30 of the insulative plate 29, it is formed a plasma confinement gap 35 (see FIG. 2) so that the discharge plasma does not leak. As the distance (clearance) of the plasma confinement gap 35, 3 mm~15 mm is reasonable. If too wider, the effect of confinement disappears.

The substrate tray N is mounted on the heating heater plate H (heating heater plate H is connected to the ground) and film formation can be conducted by the plasma discharge while controlling heating of the film formation substrate n mounted on the substrate tray N to a predetermined temperature.

Figure 5:
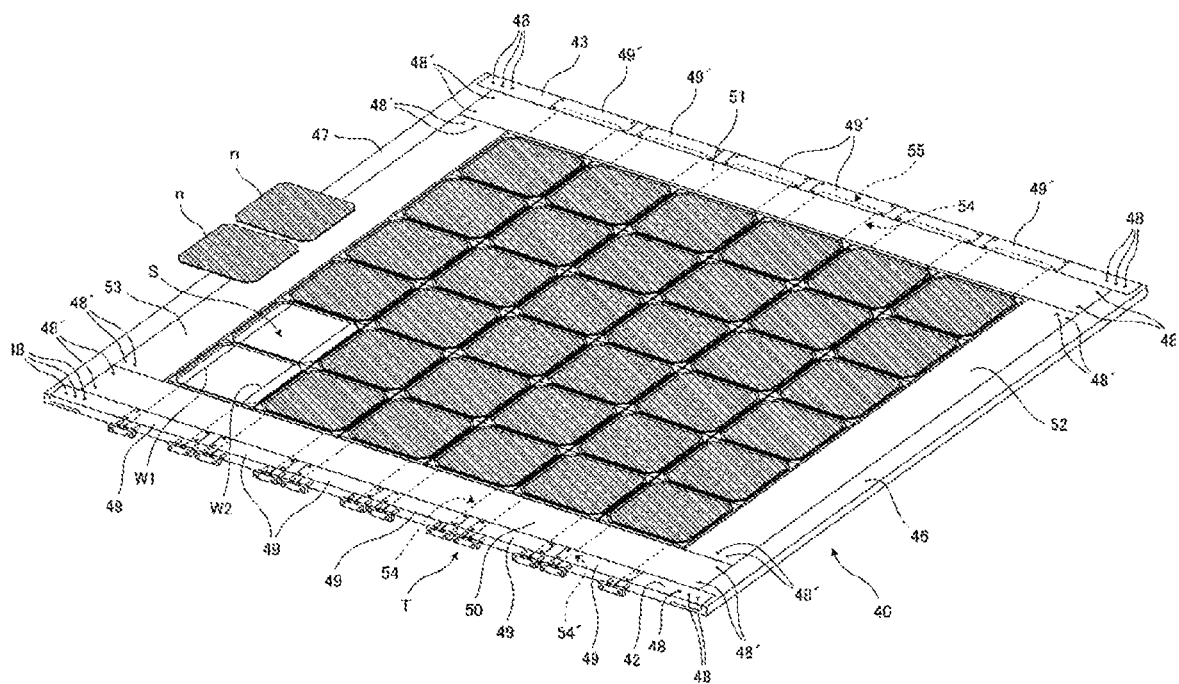
FIG. 5 is a perspective view showing s constitution of a substrate tray on which a substrate is mounted.
Figure 6A:
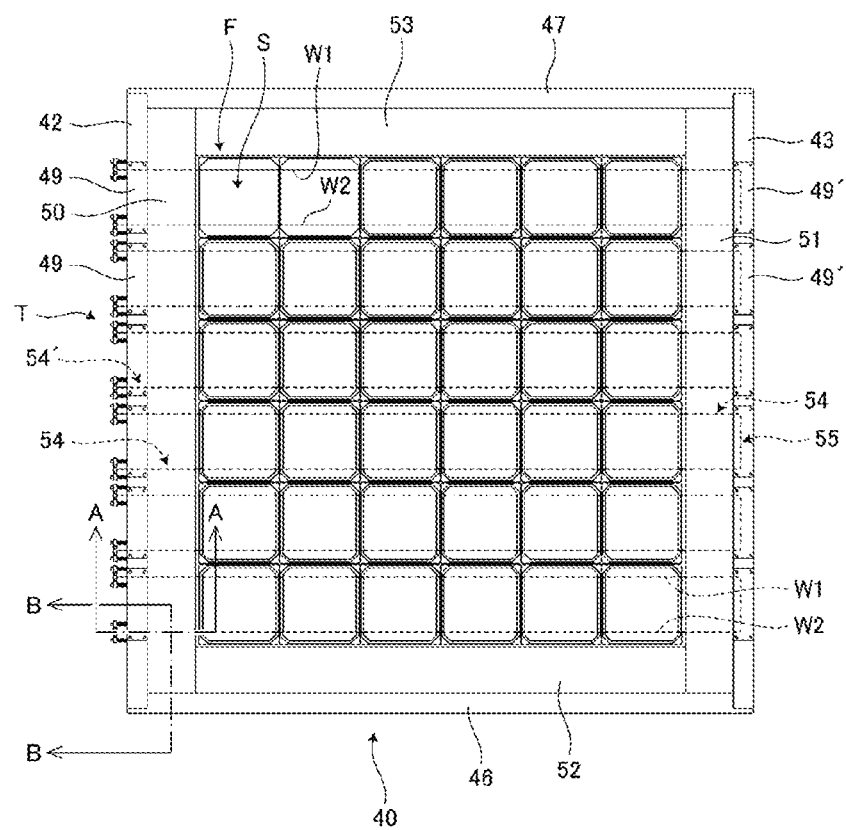
FIG. 6A is a plan view showing the substrate tray and FIG. 6B is a side view showing the substrate tray.
Figure 6B:
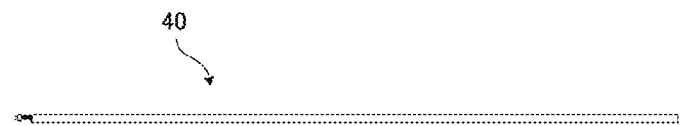
Figure 7A:
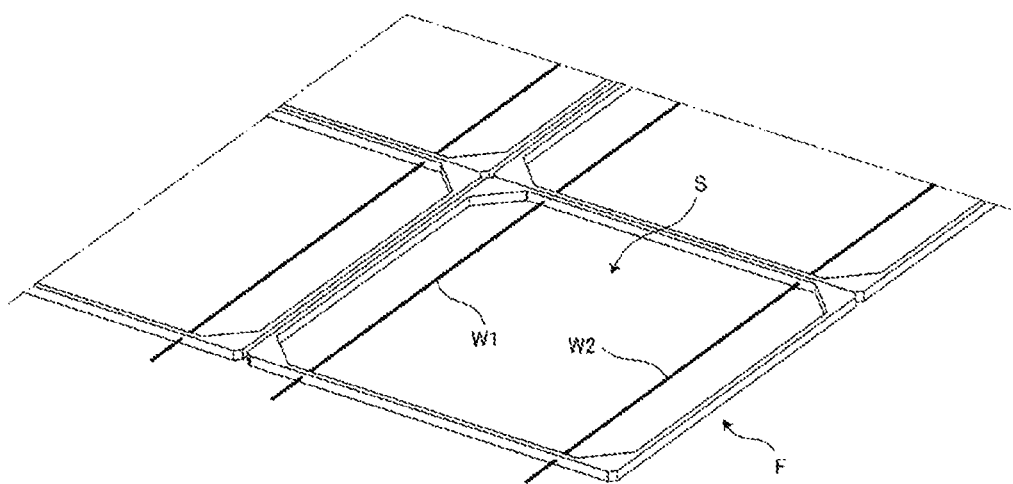
FIG. 7A is a perspective view showing a partition frame in which a wire is inserted.
Figure 7B:
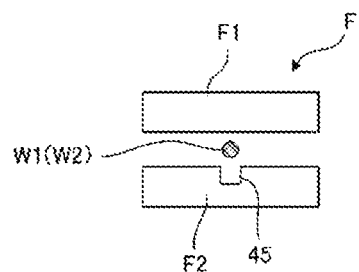
FIG. 7B is an exploded view showing an upper side and a lower side frames and the wire which constitute the partition frame and FIG. 7C is a view showing the upper side and the lower side frames and the wire which constitute the partition frame.
Figure 7C:
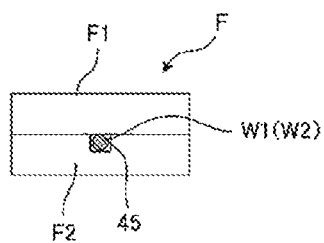
Figure 8:
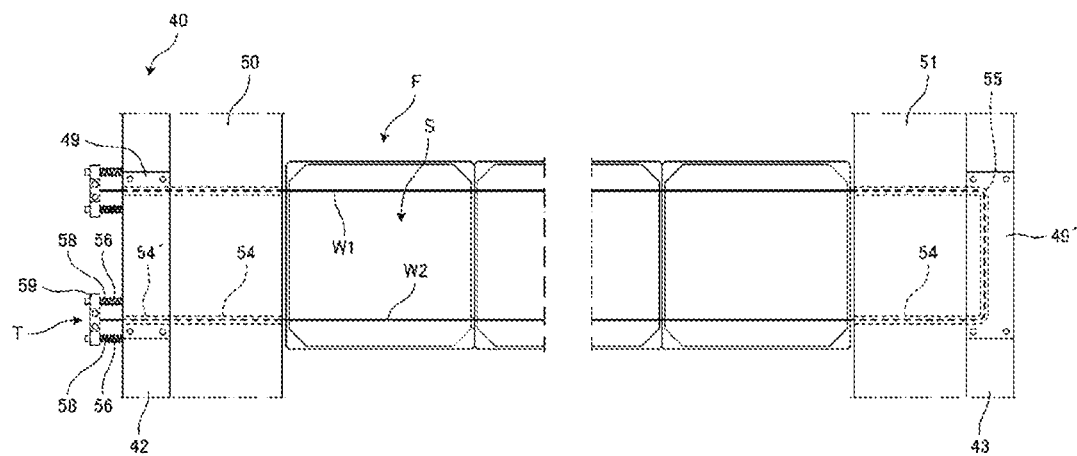
FIG. 8 is a plan view showing a main part of the substrate tray.
Figure 9:
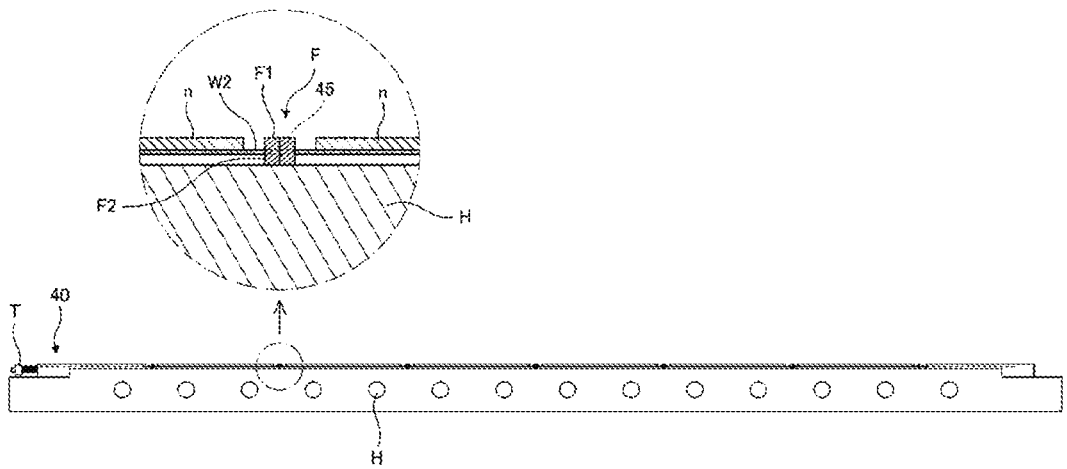
FIG. 9 is a side view showing a state that a heating heater plate is contacted with the substrate tray.
Figure 10:
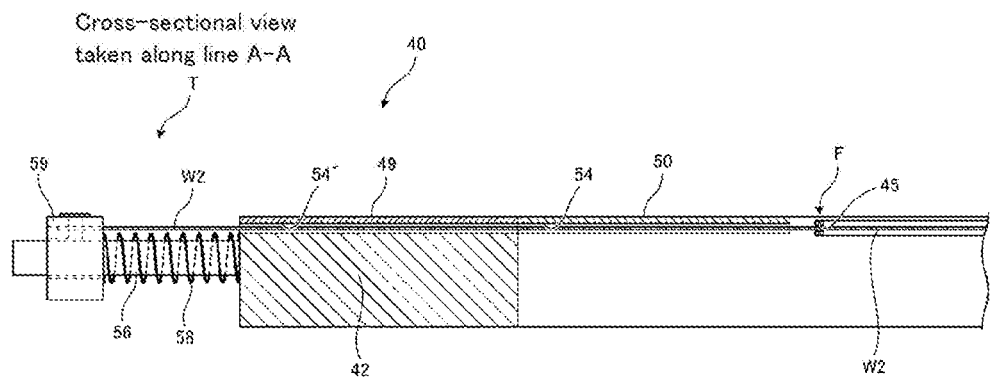
FIG. 10 is a sectional view sectioned by a A-A line in FIG. 6.
Figure 11:
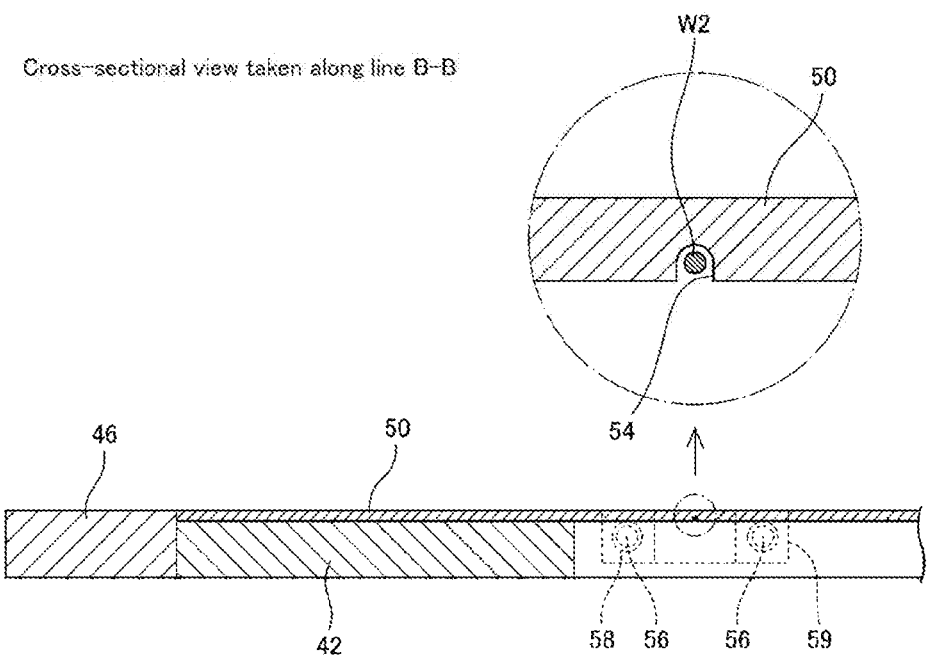
FIG. 11 is a sectional view sectioned by a B-B line in FIG. 6.
Figure 12:
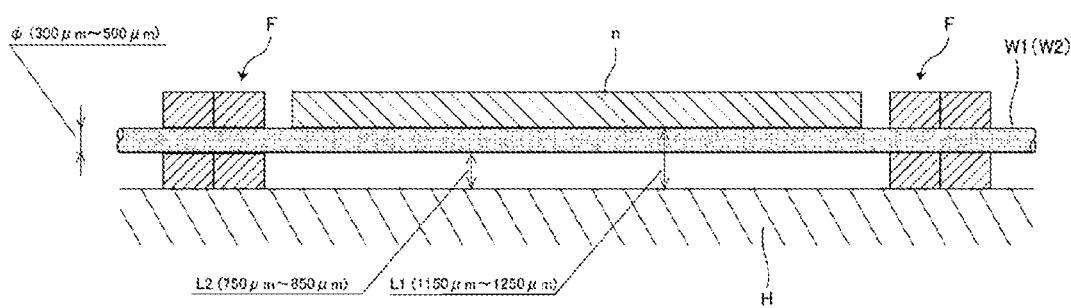
FIG. 12 is a side view showing a state that the substrate is mounted on the substrate tray and the heating heater plate is contacted.

The substrate tray N according to the gist of the present invention is constituted as follows. FIG. 5 is a perspective view showing s constitution of the substrate tray on which the substrate is mounted, FIG. 6A is a plan view showing the substrate tray N, FIG. 6B is a side view showing the substrate tray N, FIG. 7A is a perspective view showing a partition frame F of the substrate in which wires W1, W2 are inserted, FIG. 7B is an exploded view showing an upper and a lower side frames F1, F2 and the wires W1, W2 which constitute the partition frame F, FIG. 7C is a view showing the upper side and the lower side frames F1, F2 and the wires W1, W2 which constitute the partition frame F, FIG. 8 is a plan view showing a main part of the substrate tray N, FIG. 9 is side view showing a state that the heating heater plate H is contacted with the substrate tray N, FIG. 10 is a sectional view sectioned by a A-A line in FIG. 6, FIG. 11 is a sectional view sectioned by a B-B line in FIG. 6, FIG. 12 is a side view showing a state that the substrate n is mounted on the substrate tray N and the heating heater plate H is contacted.

As shown in FIGS. 5 and 6, the substrate tray N is constituted from a rectangular outer frame 40, shield plates 50, 51, 52, 53 formed in a rectangular shape with a predetermined width along an inner peripheral portion of the outer frame 40 and partition frames F many of which are adjacently laid within the shield plates 50, 51, 52, 53, a substrate mounting space S formed within the partition frame F substantially corresponding to the shape of the substrate n and wires W1, W2 with a diameter of 0.3 mm 0.5 mm stretched so as to cross the substrate mounting space S between a front side frame 42 and a rear side frame 43 opposing in the outer frame 40.

Combining of the outer frame 40 and the shield plates 50, 51, 52 and 53 is constituted as follows. Both ends of a left side frame 46 and a right side frame 47 of the outer frame 40 are formed into a substantial L-shape in sectional view, the front and rear side frames 42 and 43 are installed to both ends of the left and right side frames 46, 47, ends thereof are overlapped and fixed by mounting bolts 48, thereby the outer frame 40 is constituted. Further, on upper surfaces of the front and rear side frames 42, 43, wire covers 49, 49' are screwed. Further, the front, rear and the left, right shield plates 50, 51, 52, 53 are dropped in pins 48' along the rectangular inner edge portion of the outer frame 40 and fixed.

The partition frame F is constituted from a single frame having the substrate mounting space S on which one substrate n with a predetermined outline is mountable or a composite frame having a plurality of substrate mountable spaces S and a shape of the partition frame F is constituted from a substantially quadrangular frame which is enlarged by 0.1 mm~1.0 mm than a shape of the substrate n. Further, a shape of the substrate mountable space S inside of the quadrangular frame is formed corresponding to the shape of the substrate n and a space enclosed by the quadrangular frame is set to the substrate mountable space S. The shape of the substrate mountable space S corresponds to every shape of the substrate n.

The partition frames F are arranged in matrix within the outer frame 40 and compartmentalized in a grid.

There are stretched wires W1, W2 continuously connected to a tension mechanism T provided in the front side frame 42, between the front and rear side frames 42, 43 of the outer frame 40.

As shown in FIG. 7, the wires W1, W2 are inserted through a wire insertion hole 45 drilled in a longitudinal direction (left-right direction may be utilizable) in the partition frame F and two wires are stretched so as to cross the substrate mountable space S while retaining a predetermined distance therebetween.

Therefore, two wires W1, W2 have function to hold the partition frame F in parallel in a grid within the rectangular outer frame 40 and to support the substrate n from a lower side on two wires W1, W2.

Here, in a case that the wires W1, W2 are not two, it can be constituted that many wires more than two are used, thereby the substrate n is functionally supported.

Further, the wires W1, W2 can be also stretched between the frame side frame 42, 43, 46, 47 opposing at left-right and longitudinal directions in the outer frame 40, so that the wires W1, W2 mutually cross. In this case, the substrate n can be supported from the lower side by the crossed wires W1, W2.

Further, as shown in FIG. 7, when the wires W1, W2 are transversely stretched in the substrate mountable space S of the partition frame F, except for a case that the wires W1, W2 are inserted in the wire insertion hole 45 drilled in the partition frame F, it can be adopted a constitution that the partition frame F is constituted from upper side and lower side partition thin frame F1, F2 which are layered and the wires W1, W2 are clamped in a groove of lamination surface of the upper side and lower side partition frame F1, F2 and the wires W1, W2 are transversely stretched through the substrate mountable space S. Further, the upper side and lower side partition frames F1, F2 are joined by diffusion bonding, spot welding and screwing and the like.

As mentioned, the partition frame F is laid in a grid within an inner space of the outer frame 40 by the wires W1, W2 stretched within the outer frame 40.

Further, the substrate tray N is conveyed in the plasma treatment device M, and as shown in FIG. 9, the partition frame F arranged in matrix with the outer frame 40 of the substrate tray N is mounted on the heating heater plate H.

For the outer frame 40 constituted in the above, it is desirable to use, as material thereof, rust prevention metal such as aluminum or stainless steel on which surface treatment is done or alumina ceramic.

The partition frame F is made of rust prevention metal such as aluminum or stainless steel with a thickness of 2 mm. A diameter of the wire insertion hole 45 to insert the wires W1, W2 is set to 0.6 mm~0.7 mm if a diameter of the wire W1, W2 is set to 0.5 mm Further, it is desirable that clearance (tolerance) to enlarge by 0.3~0.5 mm against the outer dimension of the mounted substrate n is formed in the dimension of the substrate mountable space S within the outer frame 40.

Here, other than the rectangular shape, the shape of the substrate mountable space S may be formed in a shape matched with the shape of the substrate n. Also in this case, a clearance (tolerance) of 0.3 mm~0.5 mm is formed between the outer shape of the substrate n and the outer edge of the space S.

Further, upper surface of the shield plate 50, 51, 52, 53 provided along an inner peripheral edge of the outer frame 40 is set to the same level position as upper surface of the frame F installed while inserting the wires W1, W2, or is set to a position slightly higher than the upper surface of the frame F. Upper surface of the substrate n mounted on the substrate mountable space S within the partition frame F is set to a position as same as the upper surface of the partition frame F or to a position lower than the upper surface of the partition frame F by about 200 μm~350 μm.

Further, it may be desirable that the wires W1, W2 are made of stainless steel or tungsten on request of tensile strength, heat-resistance, rust prevention and a diameter thereof is 0.3 mm~0.5 mm.

Further, when above wire diameter is adopted, in the shield plates 50, 51, 52, 53 provided in the outer frame 40 and its inner peripheral edge, a wire insertion groove 54' and a wire receiving groove 54 (see FIGS. 8. 10. 11) to insert the wires W1, W2 are respectively formed.

That is, on a surface of the front side frame 42 to which the tension mechanism T to pull the wires W1, W2 is provided, the wire insertion groove 54' with a width of 1 mm and a depth of 1 mm is engraved when the wire diameter of the wires W1, W2 is set to 0.5 mm. Further, on a surface of the rear side frame 43 positioned at opposite side of the tension mechanism T, a return wire groove 55 (see FIG. 8) with a width of 1 mm and a depth of 1 mm is engraved.

Further, the wires W1, W2 are pulled between the front and rear side frames 42, 43 each of which opposes. Both ends of the wires W1, W2 are continuously connected to the tension mechanism T mentioned later and intermediate portions of the wires are retuned in the rear side frame 43 while crossing the substrate mountable space S.

Returning portion of the wires W1, W2 is formed along the return wire groove 55 which is engraved in a U-return shape in the rear side frame 43. Therefore, among partition frames F laid on the front and rear side frames 42, 43, in the partition frames F of each front and back row, left and right both ends of the one wire W1, W2 are respectively connected to two left and right tension mechanisms T and intermediate portion thereof is returned within the rear side frame 43 and left and right two wires cross the substrate mountable spaces S in the front and rear direction.

As shown in FIGS. 8 and 10, the tension mechanism T is constituted as follows and is arranged at positions corresponding to left and right ends of the partition frame F extending in one row in front and rear direction and the left and right both ends of the wires W1, W2 are respectively connected to the left and right tension mechanisms T.

The tension mechanism T is constituted from two slide shafts 56 protruded at regular intervals from an outer side surface of the front side frame 42, coil springs 58 wound around each slide shaft 56 and a slide body 59 slidably installed between two slide shafts 56 under a state that urging force of the coil springs 58 is exerted.

Left and right both ends of the returned wire W1, W2 are respectively tightened and fixed to the left and right slide bodies 59.

Therefore, both ends of the wires W1, W2 are pulled and urged toward outer side direction through the slide bodies 59 by urging force of the coil springs 58, therefore intermediate portion of the wires W1, W2 is in a tightened state through the returned portion and supports the substrate n while crossing the substrate mountable space S.

As mentioned, according to the tension mechanism T, the substrate n is supported and mounted on the wires W1, W2 stretched in the substrate mountable space S and further the heating heater plate H is positioned so as to support the outer frame 40 under the wires W1, W2.

At that time, a clearance between an upper surface of the heating heater plate H and a back surface of the substrate n is set to about 1.25 mm (1250 μm) and a clearance (distance) between a bottom surface of the partition frame F and a back surface of the wire (W1, W2) is set to 0.75 mm (750 μm). Therefore, when the diameter of the wire (W1, W2) is set to 300 μm~500 μm, under a state that the diameter size φ of the wire (W1, W2) mounting the substrate n is included as shown in FIG. 12, the clearance between the back surface of the substrate n and the upper surface of the heating heater plate H becomes 1150 μm~1250 μm. The distance in which the wire (W1, W2) is added to the clearance (distance) between the wire (W1, W2) and the bottom surface of the partition frame F becomes substantially (due to tolerance of wire diameter and wire insertion hole 45) as same as at least the distance from the back surface of the substrate n to the upper surface of the heating heater plate H.

As mentioned, based on that it is constituted so as to retain the distance relation of the substrate n, the wire (W1, W2), the partition frame F and heating heater plate H, heating from the heating heater plate H can be uniformly, quickly and efficiently carried out and film formation on the substrate n can be uniformly conducted with good quality based on that the plasma discharge is effectively realized.

Figure 13:
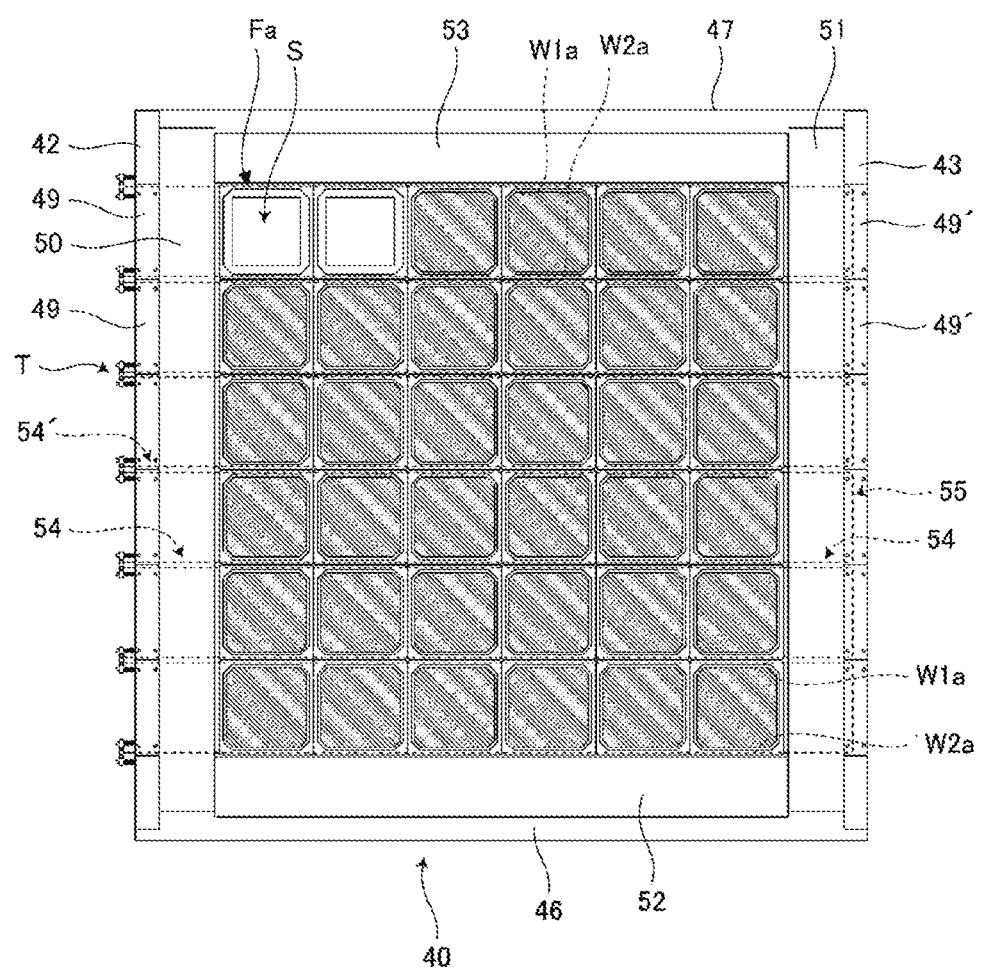
FIG. 13 is a plan view showing a constitution of substrate tray according to another embodiment.
Figure 14A:
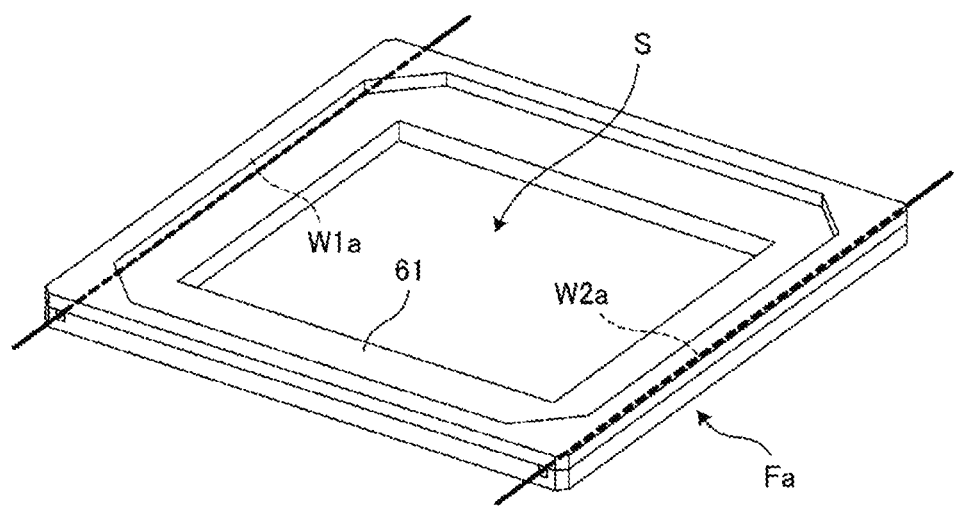
FIG. 14A is a perspective view of the partition frame (1×1) capable of mounting one substrate and FIG. 14B is a constitutional view thereof.
Figure 14B:
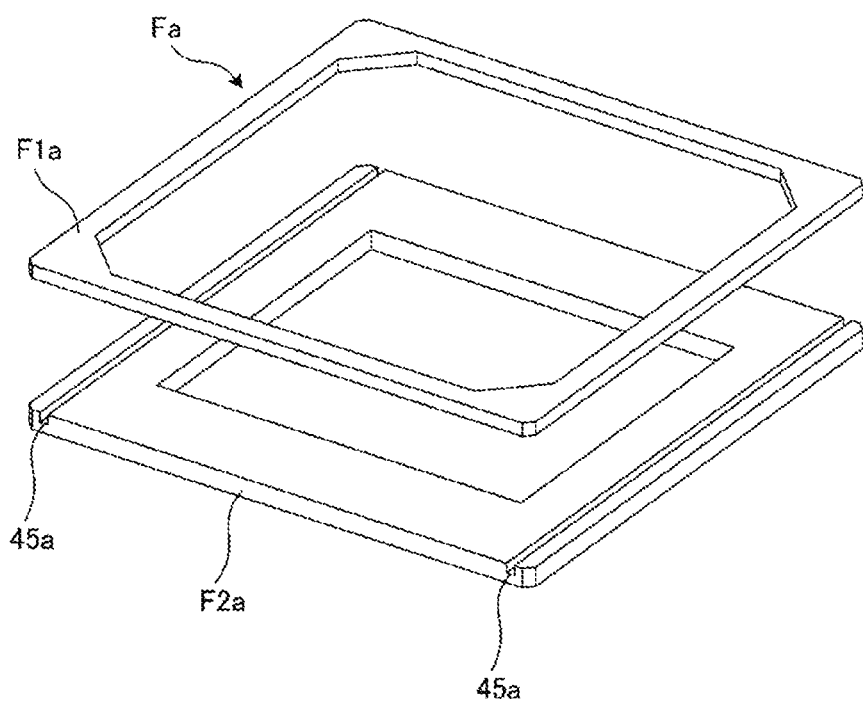

In the embodiment mentioned in the above, although it is explained an example in which the substrate n is mounted on the wires (W1, W2), in the present embodiment, there is a possibility that film formation is done to the back surface of the substrate n due to that active species are wrapped around from a peripheral clearance (tolerance) of the partition frame F and the substrate n mounted thereon. In the process not favorable for the film formation on the back surface, it is conceivable the next embodiment. In the next embodiment, as shown in FIGS. 13 and 14A, 14B, wire insertion grooves 45a (that is, groove in lower side partition frame F2a) are formed on the left and right side of the lower side partition frame F2a of a partition frame Fa, the wires (W1a, W2a) are fit in the wire insertion grooves 45a, the wires (W1a, W2a) are stretched between the front and rear side frames 42, 43 of the outer frame 40 and the partition Frames Fa are arranged in a grid in the space of the outer frame 40 by connecting the partition Frames Fa.

Moreover, on the upper surface of the lower side partition frame F2a, the upper side partition frame F1a is joined by diffusion bonding or spot welding, thereby the wire insertion holes 45a is closed and the partition frame Fa is constituted. Outline size of the upper and lower side partition frames (F1a, F2a) are mutually made in the same size, and as for the inner size, an opening of the lower side partition frame F2a is made narrower by 1000 μm~1500 μm than an opening of the upper side partition frame F1a. This tolerance becomes a substrate support portion 61 and at the same time, this inner side space becomes the substrate mountable space S and the substrate n is mounted on the substrate spot portion 61.

Therefore, in the embodiment mentioned in the above, the substrate tray is constituted by a case that the substrate n is mounted on the wires (W1, W2) inside of the partition frame F and the substrate n is mounted on the substrate mountable space S (there is an fear that active species excited by the plasma are wrapped around the back surface of the substrate n through the clearance of size tolerance of the substrate mountable space S and the substrate n and film formation is conducted on the back surface of the substrate n). On the contrary, in this embodiment, the wires (W1a, W2a) are inserted in the wire insertion hole 45a formed in the left and right sides of the partition frame Fa, each partition frame Fa functions as wires to arrange and support in a grid within the outer frame 40, the substrate support portion 61 protruded to the inner side edge of the substrate mountable space S functions to mount the substrate n. That is, the substrate n is supported by whole peripheral surface of the inner side edge (500 μm 750 μm) of the substrate support portion 61. Since the substrate n is supported by surface contact, it can be prevented that active species excited by the plasma wraps around the back surface of the substrate n and film formation is done. Further, the substrate n can be exactly supported and support blur and sedimentation by weight of the substrate n can be prevented as much as possible.

Figure 15A:
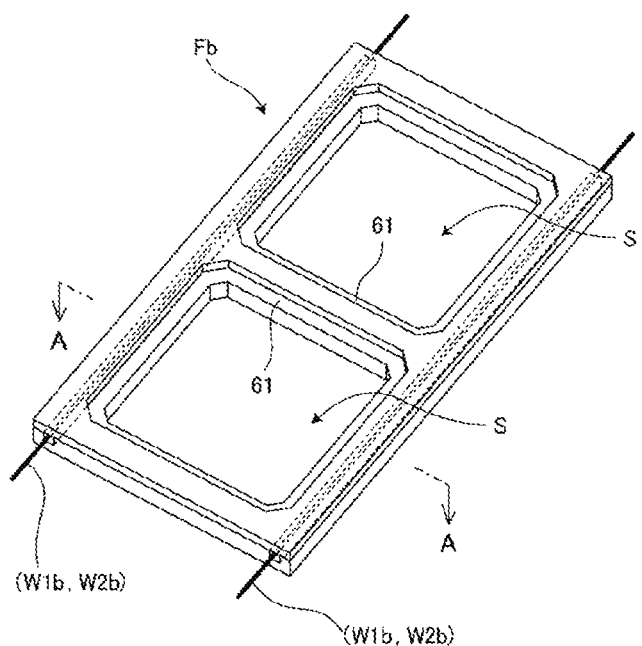
FIG. 15A is a perspective view of the unified partition frame (2×1) capable of mounting two substrates.
Figure 15B:
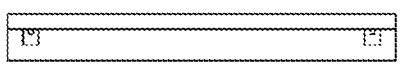
FIG. 15B is a constitutional view thereof and FIG. 15C is a sectional view thereof.
Figure 15C:
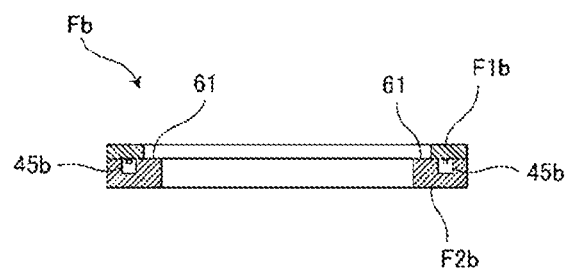
Figure 16A:
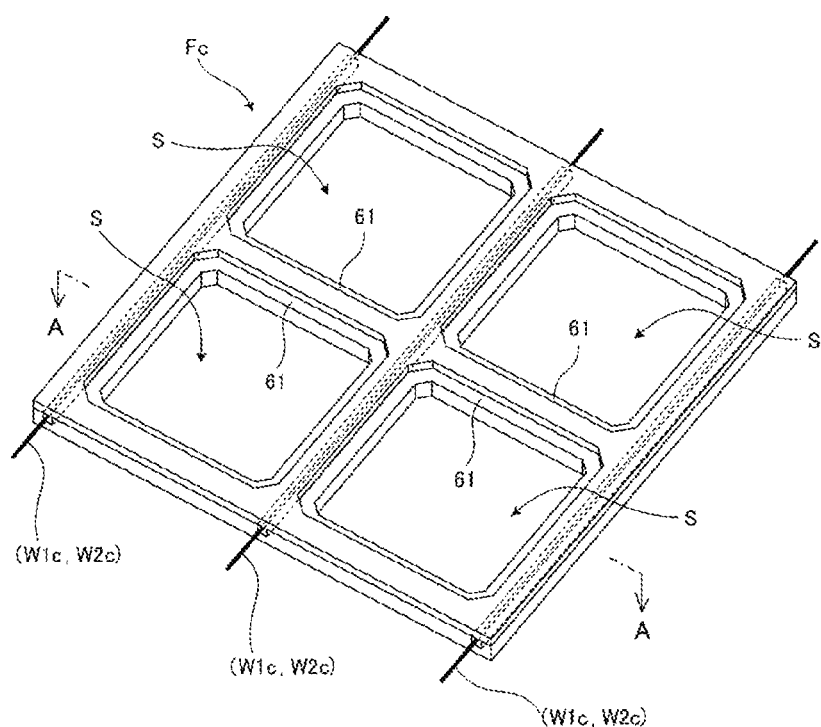
FIG. 16A is a perspective view of the unified partition frame (2×2) capable of mounting four substrates.
Figure 16B:
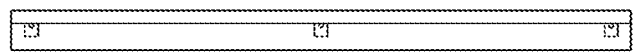
FIG. 16B is a constitutional view thereof and FIG. 16C is a sectional view thereof.
Figure 16C:
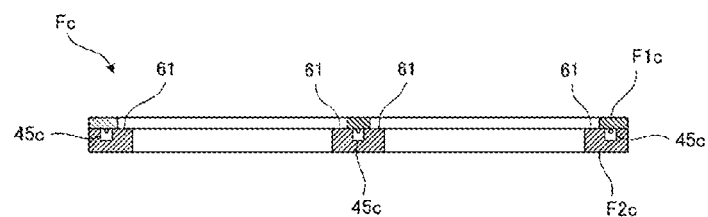

Although the partition frame F, Fa of the substrate n is a partition frame having a structure to mount one substrate n (1×1), the partition frame F, Fa may have a structure to mount a plurality of substrates n. For example, as shown in FIG. 15, it may adopt a structure to mount two substrates n (2×1) and as shown in FIG. 16, it may adopt a structure to mount four substrates n (2×2). Here, when the partition frame F, Fa become too large, there is a possibility that warp or distortion occurring by thermal expansion of the partition frame F, Fa affects the substrate n mounted on the partition frame F, Fa. Concretely, depending on a size of the substrate mounted on the partition frame F, Fa, as one example, in a case that Si-wafer of square size 156 mm×156 mm utilized as cell substrate of solar cell is mounted on the partition frame F, Fa, affect for Si-wafer of warp or distortion occurring by thermal expansion of the partition frame F, Fa was within acceptable range (experimental result) if the outline size of the partition frame F, Fa lies in a range within square size 350 mm×350 mm. Conversely, if the outline size of the partition frame F, Fa becomes a size exceeding square size 350 mm×350 mm, surface temperature distribution of Si-wafer mounted on the partition frame F, Fa remarkably deteriorated by affect of warp or distortion due to thermal expansion of the partition frame F, Fa. According to this result, the partition frame Fb mounting two substrates n (2×1) shown in FIG. 15 and the partition frame Fc mounting four substrates n (2×2) are also included within a scope of the present invention. In short, in the CVD device using substrate heating, as for the size of the substrate partition frame, about square size 350 mm×350 mm is the limit and it is no matter how many substrates n are mounted within this range. Here, references F1b, F1c in FIGS. 15 and 16 represent the upper side partition frame, F2b, F2c represent the lower side partition frame, W1b, W2b, W1c, W2c represent the wires and 45b, 45c represent the wire insertion holes.

Figure 17:
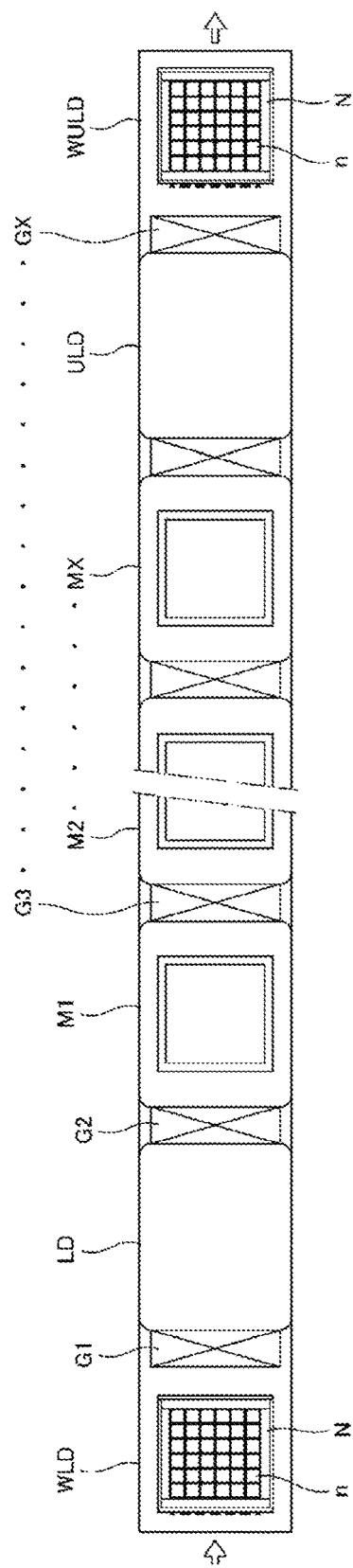
FIG. 17 is a view showing an example of the plasma treatment system of inline method for mass production.
Figure 18:
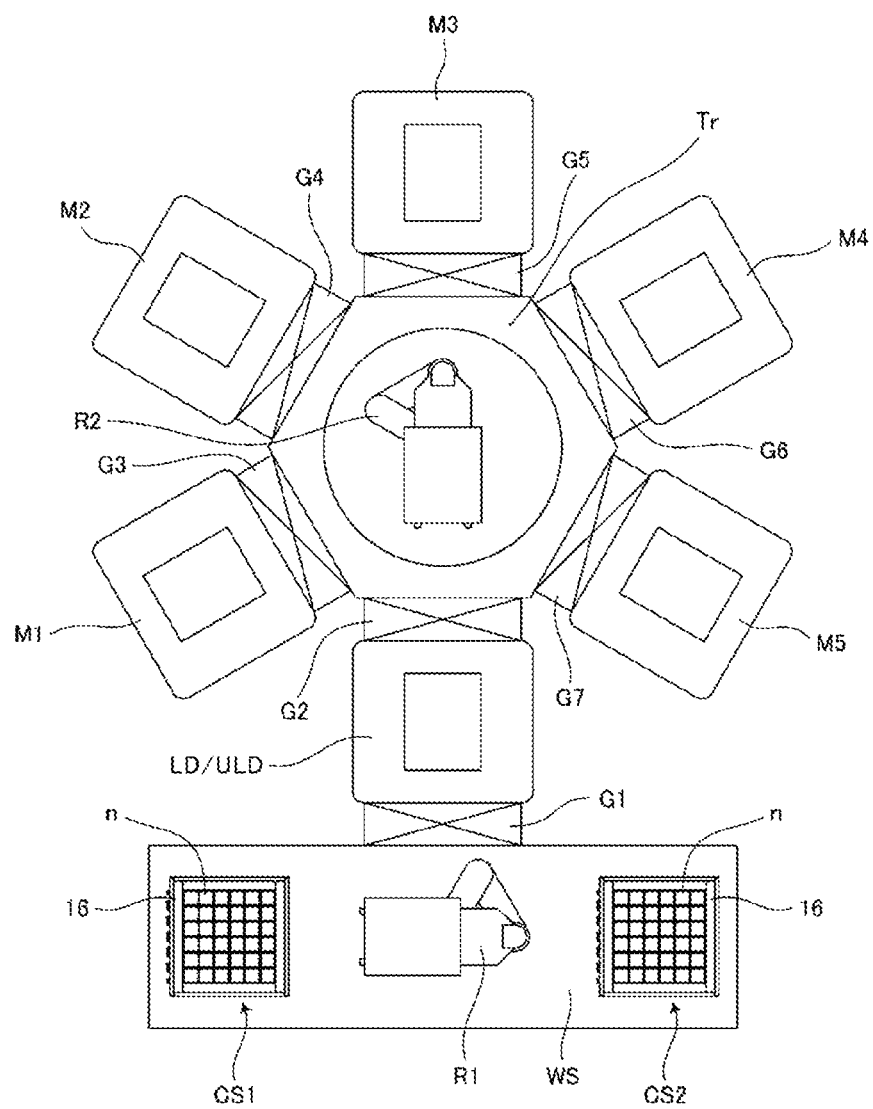
FIG. 18 is a view showing an example of the plasma treatment system of cluster method for mass production.

Although film formation treatment by using a single plasma treatment device is as the above, when the plasma treatment device 1 is actually used, as shown FIGS. 17 and 18, it is used as a plasma treatment system in which a plurality of plasma treatment rooms M1~MX (X is a natural number) are arranged in series or in parallel. FIG. 17 shows a plasma treatment system of inline manner and FIG. 18 is a plasma treatment system of cluster manner. Hereinafter, the plasma treatment system of inline manner shown in FIG. 17 will be described.

A substrate n conveyed from a previous process is mounted on the substrate tray N of a work loader WLD. The substrate tray N on which the substrate n is mounted opens a gate valve G1 (OPEN) and is conveyed to a load lock room LD. Thereafter the gate valve G1 is closed (CLOSE) and the load lock room LD is drawn a vacuum. When the load lock room LD reaches the degree of vacuum as same as that of the plasma treatment room M1, a gate valve G2 is opened (OPEN) and the substrate tray N is conveyed to the plasma treatment room M1, thereafter the gate valve G2 is closed (CLOSE). After the process gas G a flow rate of which is controlled is supplied (ON) and is adjusted to a process pressure, the frequency power is added (ON) to the plasma treatment room M1, thereafter the plasma treatment (film formation) is started. At that time, it is a premise that the heating heater plate H is adjusted to a process temperature (optimal substrate temperature) which is set beforehand. Further, after the gate valve G2 is closed (CLOSE), the load lock room LD is returned to atmospheric pressure. The gate valve G1 is opened (OPEN) and the substrate tray N on which the next substrate n is set is conveyed to the load lock room LD. After the plasma treatment (film formation) is finished in the plasma treatment room M1, supply of the process gas G and the frequency power are stopped (OFF). After residual gas within the plasma treatment room M1 is exhausted, the substrate tray N is conveyed to the next plasma treatment room M2 and treatment (film formation) is continuously repeated, thereafter the substrate tray N is conveyed to an unload lock room ULD. After the unload lock room ULD is returned to atmospheric pressure, the substrate tray N conveyed to the unload lock room ULD opens a final gate valve GX (X is a natural number) (OPEN) and is carried out to a work unloader WULD. The final gate valve GX is closed (CLOSE) and the unload lock room ULD is drawn a vacuum and the system waits. At the same time, the substrate n is taken out at the work unloader WULD and the substrate n which is taken out is shifted to the next process. The substrate tray N from which the substrate n is taken out is returned to the work loader WLD by a return mechanism. As mentioned, treatment (film formation) is sequentially conducted.

According to the experimental result in the atmosphere, the time taken in raising the temperature from the room temperature (30° C.) to the process preset temperature (190° C.~210° C.) was about 30 sec~50 sec. At that time, the surface temperature distribution (one point for center and diagonal four points entering inside by 5 mm from substrate periphery) was within ±1° C. against the process preset temperature. According to the experimental result in vacuum, the time taken in raising the temperature from the from temperature (30° C.) under the same condition in the atmosphere to the process preset temperature (190° C.~210° C.) was about 60 sec. At that time, the surface temperature distribution (one point for center and diagonal four points entering inside by 5 mm from substrate periphery) was within ±3° C. against the process preset temperature.

The present invention is not limited to the embodiments described in the above and it is included a constitution in which each constitution disclosed in the above embodiment is mutually substituted or combination thereof is changed, or a constitution in which prior art and each constitution disclosed in the above embodiment are mutually substituted or combination thereof is changed. Further, technical scope of the present invention is not limited to the above embodiment and includes both technical matter described in claims of the present invention and equivalents.

REFERENCE SIGNS

1 . . . reaction vessel body
3 . . . lid member
4 . . . high frequency matching device
5 . . . shield box
7 . . . wiring board
8 . . . gas communication path
9 . . . nut
10 . . . supporting cylinder
12,12' . . . connection fittings
13 . . . process gas pipe
14 . . . insulative gas introduction pipe
15 . . . side communication passage
17 . . . insulative ring
20 . . . electrode elevation plate
21 . . . metallic flange
27 . . . shield plate
29 . . . insulative plate
30 . . . side insulative plate
31 . . . electrode plate
32 . . . gas dispersion plate
32' . . . upper small hole
33 . . . intermediate dispersion plate
33' . . . intermediate small hole
34 . . . gas shower plate
34' . . . lower small hole
35 . . . plasma confinement gap
P . . . plasma discharge space
A . . . electrode rod
A1 . . . shield pipe
A2 . . . insulative pipe
A3 . . . high frequency conduit
A4 . . . gas communication hole
S1, S2, S3 . . . gas dispersion space
M . . . plasma treatment device
n . . . substrate
N . . . substrate tray
H . . . heating heater plate
T . . . tension mechanism
40 . . . outer frame
42 . . . front side frame
43 . . . rear side frame
45, 45a, 45b, 45c . . . wire insertion hole
46 . . . left side frame
47 . . . right side frame
48 . . . mounting bolt
48' . . . pin
49, 49' . . . wire cover plate
50~53 . . . shield plate
54 . . . wire receiving groove
54' . . . wire insertion groove
55 . . . return wire groove
56 . . . slide shaft
58 . . . coil spring
59 . . . slide body
F, Fa, Fb, Fc . . . partition frame
F1, F1a, F1b, F1c . . . upper side partition frame
F2, F2a, F2b, F2c . . . lower side partition frame
S . . . substrate mounting space
W1, W2, W1a, W2a, W1b, W2b, W1c, W2c . . . wire
61 . . . substrate supporting portion
WLD . . . work loader
WULD . . . work unloader
LD . . . load lock room
ULD . . . unload lock room
G1~GX . . . gate valve
M1~MX . . . plasma treatment room

The invention claimed is:

1. A substrate tray for mounting a substrate in a thin-film formation device, comprising:
an outer frame comprising a front side frame, a right side frame, a left side frame, and a rear side frame, wherein the front side frame includes a tension mechanism, and the rear side frame includes a return wire groove;
a plurality of partition frames wherein each of the partition frames has a quadrangular frame shape, a substrate mountable space is located inside the quadrangular frame shape, and the each of the partition frames has at least one pair of a first wire insertion hole and a second wire insertion hole being opposite to one another; and a wire inserted through the first wire insertion hole, the return wire groove, and the second wire insertion hole in this order, wherein both ends of the wire are connected to the tension mechanism.

2. The substrate tray for mounting a substrate in a thin-film formation device according to claim 1, wherein the wire insertion holes are a pair of holes formed in the each of the partition frames, the wire is insertable through the holes, and the wire are clamped in the holes.

3. The substrate tray for mounting a substrate in a thin-film formation device according to claim 1, wherein the tension mechanism comprises:
a slide body to which one end of the wire is connected,
a slide shafts for slide guide of the slide body, and
coil springs wound around the slide shafts, the coil springs being located between the slide body and an outside surface of the front side frame.

4. The substrate tray for mounting a substrate in a thin-film formation device according to claim 3, wherein the slide body has left and right portions, the slide shafts have left and right shafts inserted and penetrated in the left and right portions, and the left and right shafts are capable of guiding the left and right portions of the slide body.

5. The substrate tray for mounting a substrate in a thin-film formation device according to claim 1, wherein a distance between a bottom surface of one of the partition frames and an upper surface of the wire lies in a range of 1150 µm to 1250 µm.

6. The substrate tray for mounting a substrate in a thin-film formation device according to claim 1, wherein the each of the partition frames comprises a lower part and an upper part, and the upper part is joined to the lower part.

7. The substrate tray for mounting a substrate in a thin-film formation device according to claim 6, wherein the lower part forms substrate mountable spaces in which a plurality of substrates is mountable.

8. The substrate tray for mounting a substrate in a thin-film formation device according to claim 6, wherein the lower part has a substrate support portion having an inner side edge extending inside the substrate mountable space, and the inner side edge has a peripheral surface along the quadrangular frame shape.

9. The substrate tray for mounting a substrate in a thin-film formation device according to claim 6, wherein
the lower part has a pair of grooves on an upper surface of the lower part,
the wire is clamped in the holes formed from the grooves and a bottom surface of the upper part.

10. A substrate tray for mounting a substrate in a thin-film formation device, comprising:
an outer frame comprising a front side frame, a right side frame, a left side frame, and a rear side frame, wherein the front side frame includes a tension mechanism, and the rear side frame includes a return wire groove;
a plurality of partition frames wherein each of the partition frames has a quadrangular frame shape, a substrate mountable space is located inside the quadrangular frame shape, and the each of the partition frames has at least one pair of a first wire insertion hole and a second wire insertion hole being opposite to one another; and
a wire inserted through the first wire insertion hole, the return wire groove, and the second wire insertion hole in this order, wherein both ends of the wire are connected to the tension mechanism,
wherein the partition frames are arranged in a grid inside the outer frame, and
the wire is inserted through the return wire groove and connected to the front side frame by the tension mechanism.

11. The substrate tray according to claim 10, wherein the substrate fit inside the substrate mountable space.

* * * * *